United States Patent

Lu

[19]

[11] Patent Number: 5,837,404
[45] Date of Patent: Nov. 17, 1998

[54] FABRICATION OF ZERO LAYER MASK

[75] Inventor: Bing-Yau Lu, Taipei, Taiwan

[73] Assignee: Holtek Microelectronics, Inc., Hsinchu, Taiwan

[21] Appl. No.: 792,749

[22] Filed: Jan. 4, 1997

[51] Int. Cl.$^6$ ..................................................... G03F 9/00
[52] U.S. Cl. ................................................. 430/5; 430/22
[58] Field of Search ......................... 430/5, 22; 356/400, 356/401

[56] References Cited

U.S. PATENT DOCUMENTS

| | | | |
|---|---|---|---|
| 5,376,482 | 12/1994 | Hwang | 430/5 |
| 5,665,495 | 9/1997 | Hwang | 430/22 |

*Primary Examiner*—S. Rosasco
*Attorney, Agent, or Firm*—W. Wayne Liauh

[57] ABSTRACT

A method of fabricating a universal zero layer photomask of an integrated circuit is disclosed. With this method, only one universal zero layer mask is required for all the integrated circuit products; thus, the production cost can be reduced. In this method, the alignment marks and one or more vernier patterns are located near the edge of the effective exposure field of the wafer which takes up only a very small area of the wafer. Furthermore, the zero layer layout of the product also places the alignment marks and the vernier patterns in the same corner as the photomask. During the alignment, the wafer moves back and forth in both X and Y directions so as to match the previously recorded alignment marks positions on the mask.

4 Claims, 2 Drawing Sheets

FABRICATION OF ZERO LAYER MASK

BACKGROUND OF THE INVENTION (a) Field of the Invention

The present invention relates to the fabrication of integrated circuits (ICs), and, more particularly, to the method of fabricating zero layer photomasks.

(b) Description of the Prior Art

In order to produce an integrated circuit, the circuit layout patterns are transferred from photomasks to the surface of the silicon wafer using the photolithography process. Each layer subsequent to the zero layer must be carefully aligned with respect to the previous pattern on the wafer. Alignment marks are introduced on each mask and transferred to the wafer as part of the integrated circuit pattern. Computer-controlled alignment equipment such as stepper, has been developed to achieve the level of sub-micron VLSI process precision (typically 0.6 $\mu$m with a tolerance of ±0.15 $\mu$m).

One of the most commonly used commercial alignment methods utilizing a stepper in today's VLSI industry was developed by Nikon Company, which places several alignment marks along the scribed lines in the X and Y directions, as shown in FIG. 1. The advantage of this method is that there are several alignment marks for each die; this can improve the alignment accuracy. However, this method requires an extra zero layer mask for each product to accommodate their different die sizes. This increases the production cost. The so-called zero layer is the initial layer (which is typically the oxide or nitride layer) formed on a semiconductor wafer without being etched. Therefore, there are no rough topologies which can be utilized for alignment purpose. And the zero-layer photomasks must depend on the alignment marks which are provided on the surface of the zero layer for alignment.

SUMMARY OF THE INVENTION

The primary object of the present invention is to provide a new method for fabricating alignment marks in a zero layer photomask which can be employed in a variety of products.

Another object of the present invention is to provide a new method of fabricating photomasks which can reduce the production cost.

In accordance with these objects of the present invention, a novel method for fabricating alignment marks in a zero layer mask is achieved.

The present invention involves the use of a universal zero layer mask, whose layout is similar to the conventional Nikon method, which places several alignment marks along scribed lines in the X and Y directions. The main difference is that the alignment marks of the present invention are located near the edge of the effective exposure field of the wafer which takes very small area of the wafer. Therefore, it can be utilized in the manufacture of essentially any product. The positions of the alignment marks are then recorded.

Next, the zero layer layout of the product also places the alignment marks and vernier patterns in the scribed lines. During the alignment process, the wafer moves back and forth in both X and Y directions in order to match the previously recorded positions of alignment marks on the mask. An cost-effective zero layer mask fabrication method which only needs one universal zero layer mask for every product is thus accomplished.

BRIEF DESCRIPTION OF THE DRAWINGS

In the accompanying drawings forming a material part of this specification, there is shown.

DESCRIPTION OF THE PREFERRED EMBODIMENT

The invention disclosed herein is directed to a method of fabricating a zero layer photomask of integrated circuit. In the following description, numerous details are set forth in order to provide a thorough understanding of the present invention. It will be obvious, however, to one skilled in the art of integrated circuits that variations of these specific details may be employed to practice the present invention. In other instance, well-known processing steps are not described in detail in order not to unnecessarily obscure the present invention.

The photomask used in the present invention is preferably a polished transparent plate coated with a high resolution opaque emulsion which is insensitive to red light, so that a high contrast pattern can be replicated on it. The transparent plate is typically made of quartz or glass. And the material for the desired pattern is made of thin chrome, emulsion or plastic films.

Figure 1:
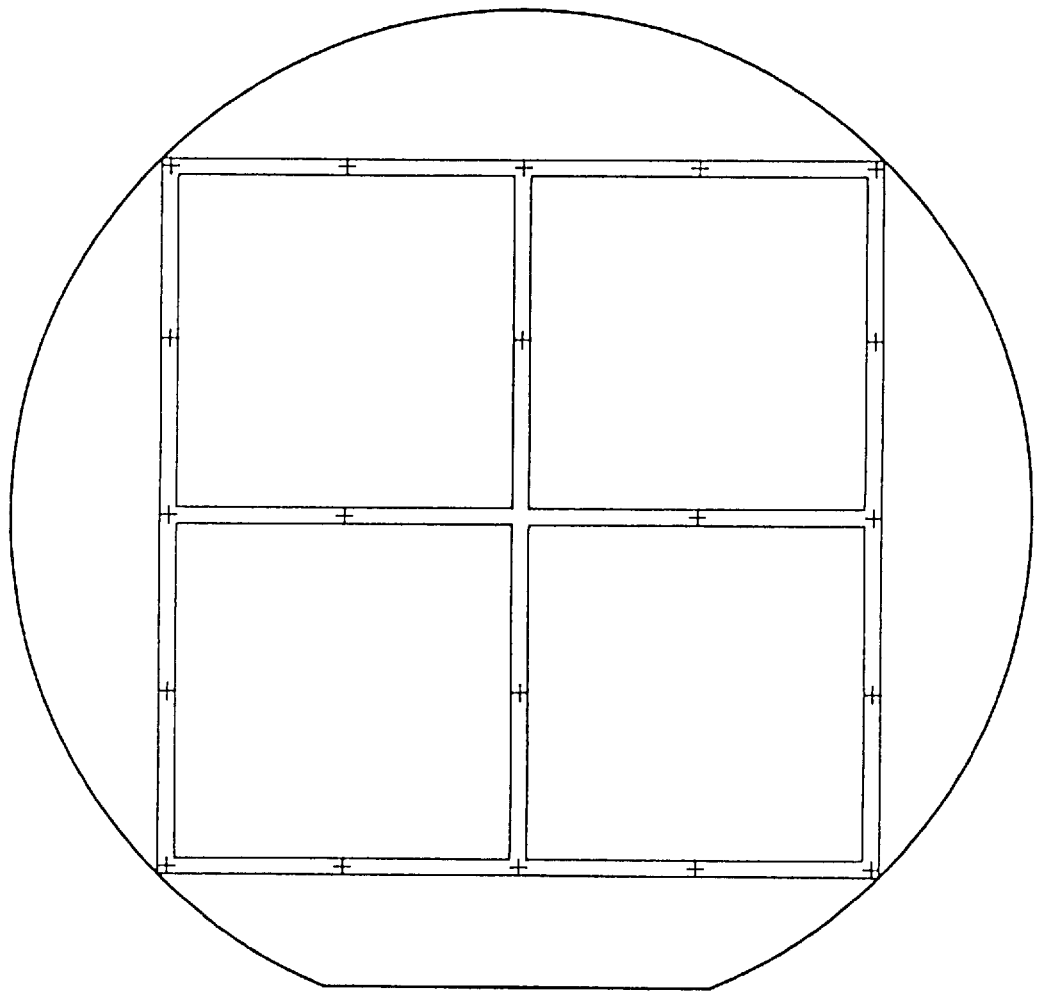
FIG. 1 is a top view of the arrangement of the alignment marks according to the prior art of the Nikon method.
Figure 2:
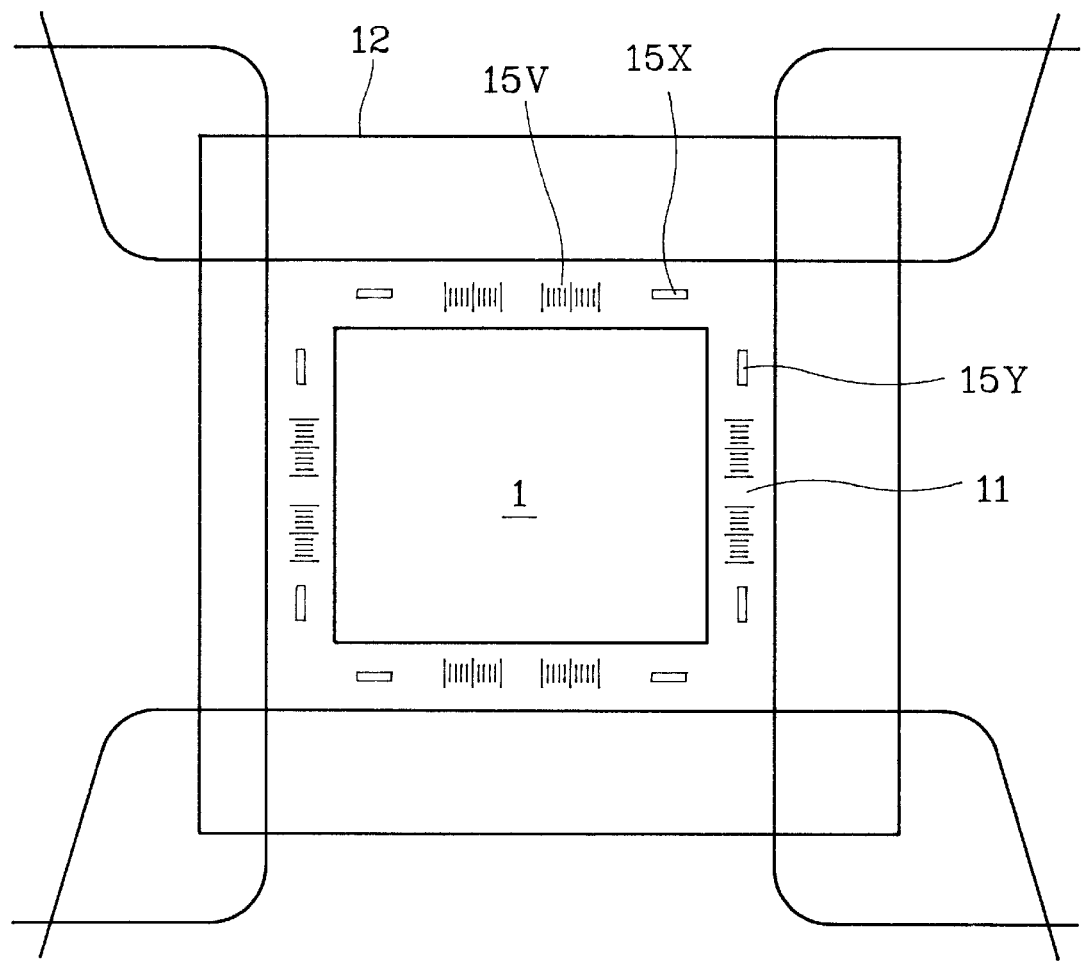
FIG. 2 is a top view of the arrangement of the alignment marks according to the present invention.

Referring now more particularly to FIG. 2, there is illustrated a top view of arrangement of the alignment marks of the present invention. The alignment marks in the zero layer photomask 12 are arranged such that a pair of alignment marks (15X, 15Y) and vernier key (15V) are provided in one of the four corners which are near the edge of the effective exposure field 11 in such a manner that the alignment marks are disposed on the two edges forming the corner and the vernier key is on one of the edges. This photomask is served as the universal zero layer mask that is the key point of the present invention. Thereafter, the positions of the alignment marks are recorded.

Referring now to FIG. 2 again, next, the circuit layout 1 for the IC product is drawn. The zero layer layout of the product also places the alignment marks and the vernier patterns in the same corner as in the photomask. During the alignment process, the wafer moves back and forth in both X and Y directions in order to match the previously recorded alignment marks positions on the mask. Therefore, any product can utilize the zero layer mask of the present invention for mass-production. A cost-effective method for fabricating photomasks that needs only one universal zero layer mask is accomplished.

While the invention has been particularly shown and described with reference to a preferred embodiment, it will be understood by those skilled in the art various changes in form and detail may be made therein without departing from the spirit and scope of the present invention.

What is claimed is:

1. A method of fabricating a universal zero layer photomask of an integrated circuit, said method comprising the steps of:

(a) obtaining a transparent photomask having a plurality of corners, each corner being formed by two intersecting edges;

(b) forming a collection of opaque regions comprising an integrated circuit layout, a pair of alignment marks and at least a vernier key on said transparent photomask;

(c) wherein said alignment marks and vernier keys are arranged in such a manner that they are clustered around one of said corners, with said alignment marks being respectively disposed on said intersecting edges that form said corner and said vernier key being disposed on one of said intersecting edges;

(d) further wherein said alignment marks and said vernier key are disposed at a predetermined distance away from said integrated circuit layout so as to allow said photomask, which contains said alignment marks and said vernier key clustered around one corner, to serve as a universal zero layer photomask.

2. The method of claim 1, wherein said transparent photomask is made of a material selected from the group consisting of quartz and glass.

3. The method of claim 1, wherein said opaque regions are made of a material selected from the group consisting of chrome, emulsion and plastic.

4. A method of aligning the zero layer of an integrated circuit, said method comprising the steps of:

(a) obtaining a transparent universal zero layer photomask containing an opaque integrated circuit layout, a pair of alignment marks, and at least one vernier key, wherein said alignment marks and said vernier key are clustered around one corner of said photomask, said alignmark marks are respectively disposed on two intersecting edges forming said corner, said vernier key is disposed on one of said intersecting edges, and said alignment marks and said vernier key are at a distance from said integrated circuit layout;

(b) positioning said universal photomask and recording X and Y coordinates of said alignment marks and said vernier key on said universal zero layer photomask;

(c) forming alignment marks and at least one vernier key on a product circuit layout, said alignment marks and said vernier key formed on said product circuit layout are disposed at the same relative positions as those in said universal photomask and are formed on a scribe line of said product circuit layout, and recording X and Y coordinates of said alignment marks and said vernier key on said product circuit layout; and (d) moving said product circuit layout back and forth to match the positions of said alignment marks and said vernier key of said product circuit layer with the positions of said alignmarks and said vernier key of said universal zero layer photomask.

* * * * *